(12) United States Patent
Ra

(10) Patent No.: US 6,310,577 B1
(45) Date of Patent: Oct. 30, 2001

(54) PLASMA PROCESSING SYSTEM WITH A NEW INDUCTIVE ANTENNA AND HYBRID COUPLING OF ELECTRONAGNETIC POWER

(75) Inventor: Yunju Ra, Placentia, CA (US)

(73) Assignee: Bethel Material Research, Placentia, CA (US)

( * ) Notice: Subject to any disclaimer, the term of this patent is extended or adjusted under 35 U.S.C. 154(b) by 0 days.

(21) Appl. No.: 09/382,013

(22) Filed: Aug. 24, 1999

(51) Int. Cl.$^7$ ....................................................... H01Q 1/26
(52) U.S. Cl. ......................... 343/701; 343/742; 343/867; 156/345; 216/68
(58) Field of Search ..................................... 343/701, 895, 343/866, 742, 741, 867; 156/345; 216/68, 71

(56) References Cited

U.S. PATENT DOCUMENTS

| | | | |
|---|---|---|---|
| 3,832,681 | * | 8/1974 | Kaida et al. ............................ 340/58 |
| 5,091,049 | * | 2/1992 | Campbell et al. .................... 156/643 |
| 5,192,717 | * | 3/1993 | Kawakami et al. .................. 439/233 |
| 5,767,628 | * | 6/1998 | Keller et al. ....................... 315/111.51 |
| 5,818,173 | * | 10/1998 | Perrin et al. ....................... 315/111.21 |
| 6,033,481 | * | 3/2000 | Yokogawa et al. .................... 118/723 |
| 6,034,346 | * | 3/2000 | Yoshioka et al. ................. 219/121.43 |
| 6,068,784 | * | 5/2000 | Collins et al. .......................... 216/68 |
| 6,117,279 | * | 9/2000 | Smolanoff et al. .............. 204/192.12 |

* cited by examiner

*Primary Examiner*—T. Phan
(74) *Attorney, Agent, or Firm*—William J. Benman

(57) ABSTRACT

An antenna adapted to apply a uniform electromagnetic field with high energy density to a volume of gas. The antenna includes an input node for receiving electrical energy and a first coil for radiating electromagnetic energy into the gas. The first coil is connected to the input node on one end thereof and is grounded on the opposite side to cause flux to flow in a first direction. A second coil is included for radiating electromagnetic energy into the gas. The second coil is also connected to the input node on one end thereof and grounded on the opposite side to flow in the first direction. Multiple number of coils can be added to form an antenna. In an illustrative application, the antenna is used in a plasma processing system comprising a vacuum chamber, a gas disposed within the vacuum chamber, and a dielectric disposed around the vacuum chamber. The inventive antenna is mounted around the dielectric tube and radiates electromagnetic energy into the gas. In a specific embodiment, the invention further includes a magnet disposed about the chamber in proximity to the antenna. When RF power is supplied to the antenna via an impedance matching network, the antenna radiates a uniform, dense electromagnetic wave into the gas creating plasma. The invention includes an electrically isolated electrode located on top of the source. When (RF) power is supplied to the electrode via on impedance matching network, the electrode creates an electrostatic force that pushes electrons back into plasma there by resulting in high plasma density.

15 Claims, 2 Drawing Sheets

PLASMA PROCESSING SYSTEM WITH A NEW INDUCTIVE ANTENNA AND HYBRID COUPLING OF ELECTROMAGNETIC POWER

BACKGROUND OF THE INVENTION

1. Field of the Invention

The present invention relates to plasma etching systems. More specifically, the present invention relates to plasma sources used for plasma etching, chemical and physical vapor deposition, photo-resist stripping and other applications relating to semiconductor, flat panel display, printed circuit board and other fabrication processes.

2. Description of the Related Art

Plasma sources capable of generating uniform plasma over a wide area are needed for plasma etching, plasma enhanced chemical vapor deposition (CVD), physical vapor deposition, photoresist stripping and surface treatments for many applications. Illustrative applications include silicon and compound semiconductor fabrication, flat panel display fabrication including active matrix liquid crystal display, plasma display panels, field emission displays etc. Additional applications include hard disk drive head and media manufacturing, micro-electromechanical system manufacturing and printed wiring board fabrication.

A plasma source typically includes a radio frequency antenna, a dielectric tube and a volume of gas. An electric field from an impedance matched power supply is applied to the gas by the antenna through the dielectric tube. The application of the electric field to the gas generates two fields of interest with respect to plasma etching processes: a time varying electromagnetic field and an electrostatic capacitive field. The electromagnetic field strips free electrons from the gas in accordance with a first inductive coupling gas plasma technique. Ions generated by the application of the electric field to the gas are utilized in accordance with a second capacitive gas plasma technique. Free electrons gain energy from an electric field and generate ions by colliding with neutral gases. The inductive technique is known to be more efficient in producing ions than the capacitive coupling technique. A typical plasma etcher uses additional electric fields capacitively coupled to the substrate to increase ion energy.

Plasma sources using spiral antennas have been widely used for the above-described etching and processing applications. High plasma density and electromagnetic wave coupling uniformity are needed for such applications. When the conventional spiral antenna is expanded to cover a large area, the density of the electromagnetic energy decreases and most of the energy is coupled near the antenna. Efforts to increase the number of turns in the coil of the antenna have been limited by the self-resonance of the antenna. 'Self-resonance' is an electrical characteristic of the antenna due to the inductive and capacitive effects of the antenna and limits the ability of the antenna to induce an electric field.

Also, obtaining uniform plasma was hard to achieve since the spiral antenna generates a highest electric field at the center of the source and a lower field toward the edge. Therefore, plasma has the highest density at the center and the density decreases sharply toward the edge due to dispersion. A magnetic field is often added at the plasma source wall to improve uniformity. However, even with the magnetic field, uniform plasma is hard to obtain.

Hence, there is a need in the art for a system or technique for generating a high density, uniform gas plasma affording a wide coverage area.

SUMMARY OF THE INVENTION

The need in the art is addressed by the antenna of the present invention. The inventive antenna includes an input node for receiving electrical energy and a coil for radiating electromagnetic energy into the gas. The coil is connected to the input node on one end thereof and grounded at the opposite side to cause a flux to flow. A magnet is mounted below the coil (around the dielectric tube) in parallel with a longitudinal axis thereof.

In an illustrative application, the invention is used in a plasma processing system comprising a vacuum chamber, a gas disposed within the vacuum chamber, and a dielectric disposed around the vacuum chamber. The inventive antenna is mounted around the dielectric and radiates electromagnetic energy into the gas. In a specific embodiment, the invention further includes a magnet below the coil wound around the dielectric tube and an electrically isolated top plate of the source container powered by a separate power supply. When radio frequency (RF) power is supplied to the antenna via an impedance matching network, the antenna radiates a uniform, dense electromagnetic wave into the gas creating plasma. An electrically isolated electrode is located at the top end of the dielectric tube. When (RF) power is supplied by a separate power supply the electrode induces electrostatic field which confines plasma there by increasing plasma density.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
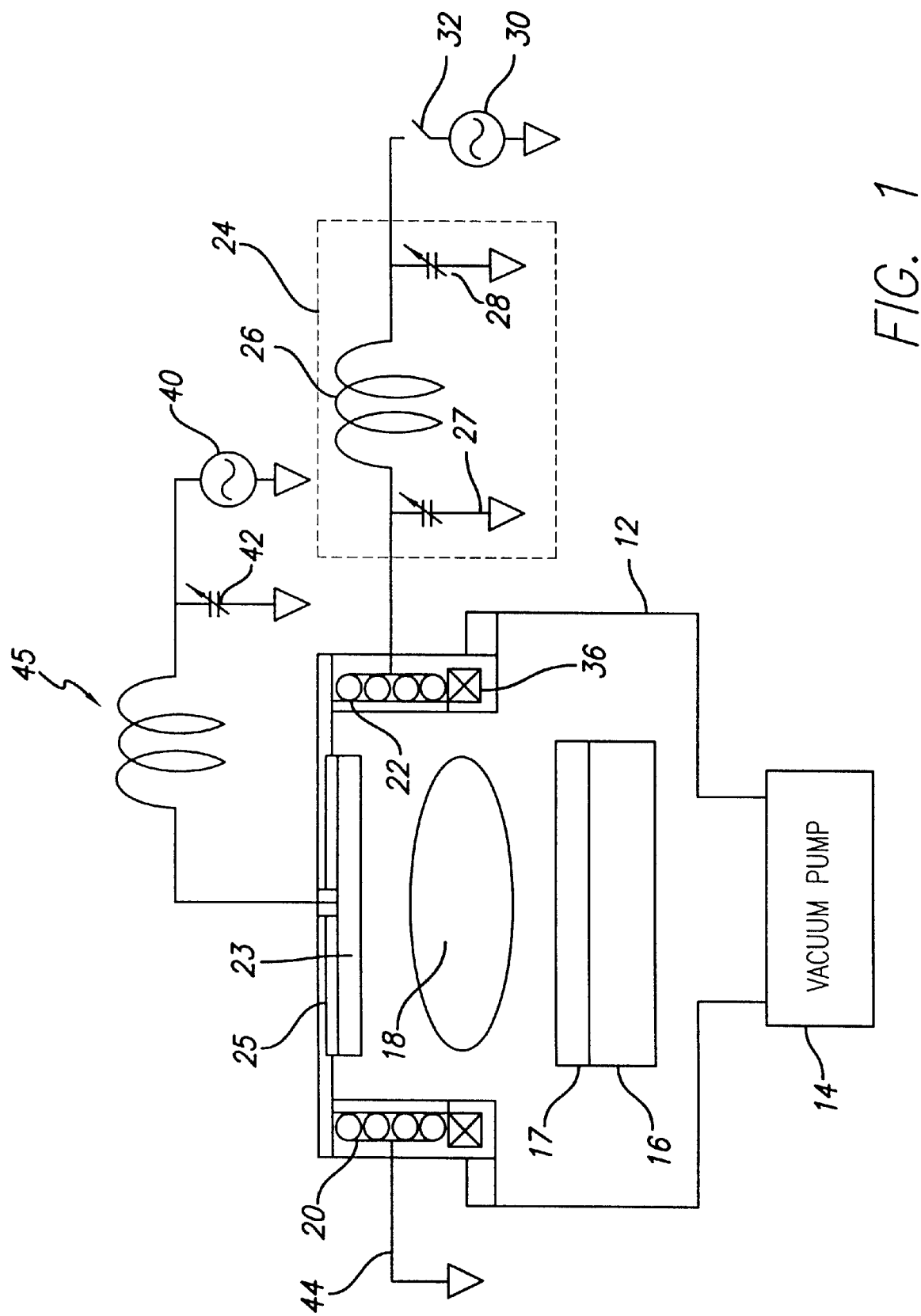
FIG. 1 is a schematic diagram of a plasma processing system incorporating the spiral antenna plasma source of the present invention.

FIG. 1 is a schematic diagram of a plasma processing system incorporating the antenna plasma source of the present invention. The system 10 includes a vacuum chamber 12, which is evacuated by a vacuum pump 14. A substrate holder 16 is shown within the chamber 12 holding a substrate 17. The antenna 20 of the present invention is mounted around a dielectric tube 22. An electrode 23 is mounted within the chamber 12 near the top thereof. The electrode 23 is a plate made of aluminum. Plural gas injection holes are provided in the electrode 23. A dielectric plate 25 is disposed between the electrode 23 and the top of the chamber 12. The dielectric plate 25 provides electrical isolation of the electrode 23.

Figure 2:
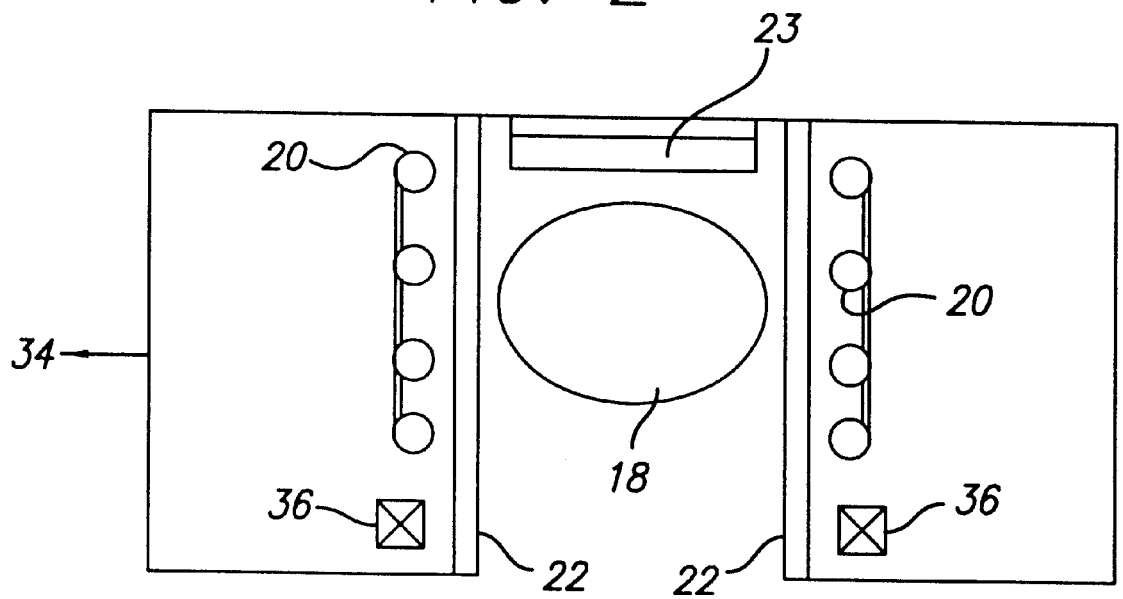
FIG. 2 is a magnified sectional side view of the antenna assembly of the present invention.

FIG. 2 is a magnified sectional side view of the antenna assembly of the present invention. As shown in FIG. 2, the antenna 20 is disposed within an annular container 34. The container 34 is made of aluminum or other suitable material. A magnet 36 is mounted below the coils 20 in parallel with the longitudinal axis thereof. The magnet improves performance by magnetically confining electrons excited within the plasma 18. Excitation of the electrons is achieved by the coupling of RF power from the antenna 20 through a dielectric tube 22. The dielectric tube 22 may be made of quartz or other suitable material. Uniform plasma density is afforded by the magnet 36 and increased energy density of the antenna 20.

Figure 3:
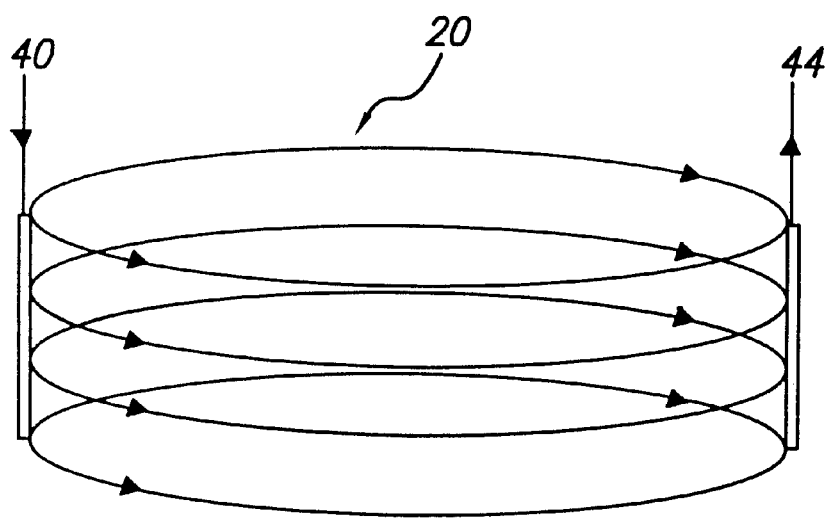
FIG. 3 is schematic diagram of the antenna of the present invention.

FIG. 3 is schematic diagram of the antenna of the present invention. The antenna 20 is shown as multiple coils of copper tubing. Those skilled in the art will appreciate that other materials may be used for the coil without departing from the scope of the present teachings. The antenna 20 has an input node to which the coils 42 are connected via line 40. The coils are terminated in a ground connection via line 44. The antenna 20 with magnet 36 excites a high electromagnetic field at the edge of the plasma source and pushes plasma into the center so at to obtain a desired plasma profile. The antenna 20 couples electromagnetic field inductively to the plasma. Most of the RF electric field will be dissipated near the antenna. Therefore, plasma has a higher density at the edge. Uniform high density plasma over a wide area can be obtained through dispersion of generated plasma into the center of the source chamber and by preventing plasma loss to the source wall using the magnetic field. This allows the plasma density profile to be easily controlled by the magnetic field. The implementation is flexible and easy in that a number of antenna turns may be added as needed. The antenna has a low self-resonance frequency.

Returning to FIG. 1, RF power is supplied to the antenna 20 by a first source 30. Energy from the first source 30 is supplied to 4he antenna 20 via a switch 32 and an impedance matching network 24. The impedance matching network 24 is represented by first and second variable capacitors 27 and 28 disposed between ground an inductive element 26. Those skilled in the art will appreciate that the impedance matching network 24 may be implemented with a variety of circuit configurations and components. A gas such as argon, oxygen or other suitable gas is provided within the chamber 12 to provide plasma 18 when an electromagnetic field is applied by the antenna 20.

The electrode 23 is powered by a second source 40 via a third variable capacitor 42 and an inductor 45. RF power is transferred to the plasma 18 through the coupling of a capacitive electrostatic force when the electrode 23 is connected to the RF power supply 40. The electrode 23 serves to improve plasma density and uniformity and enables high pressure operation.

In operation, a door (not shown) on the chamber 12 is opened and a substrate 17 mounted on the substrate holder 16 is placed inside the chamber. Next, the chamber is evacuated by the pump 14. At this point, a gas is supplied to the chamber via a gas supply and a pipe or conduit (neither of which are shown). The switch 32 is closed and RF power is supplied to the antenna 20 via the impedance matching network 24. The application of current to the antenna 20 causes the antenna to launch an electromagnetic field into the chamber. As is well known in the art, a time varying electromagnetic or capacitive field may be applied. In the preferred embodiment, a field is applied which stimulates free-electrons within the gas. The excitation of electrons within the gas operates to treat the surface of the substrate 17 as required for plasma etching, plasma enhanced CVD, physical vapor deposition, photoresist stripping and other applications as will be appreciated by those skilled in the art.

Thus, the present invention has been described herein with reference to a particular embodiment for a particular application. Capacitive electric fields are coupled by the embedded electrode and the inductive electric field by the new spiral antenna. The capacitive and inductive components of the electric field induced the in plasma may be adjusted. This allows control of the electron energy since the electron picks up more energy from the capacitive electric field than from an inductive field. The potential of the plasma can be adjusted by the voltage induced on the electrode. The energy of the ions bombarding the substrate surface can be increased by increasing the electrode voltage. The invention allows for higher plasma densities. The capacitive electric field applied to the electrode pushes electrons back to the plasma which would otherwise have been lost at the top of the source chamber by recombination with ions. The plasma of the inventive system is easier to ignite at high pressure due to the capacitive electric field. Therefore, the plasma source of the present invention can have a wide operational pressure window.

Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A plasma processing system comprising:
   a vacuum chamber;
   a gas disposed within said vacuum chamber;
   a dielectric disposed around said vacuum chamber;
   an antenna mounted around said dielectric to radiate electromagnetic energy into said gas, said antenna comprising:
      a common input node;
      a common output node;
      at least one set of semi-circular half-turn coils, each set of coils forming a circular coil and each set of coils being coaxial with the other sets of coils and connected in parallel therewith via said common input node and said common output node, whereby current flow is enabled through each half-turn of each coil from said common input node to said common output node effective to radiate electromagnetic energy into said gas; and
      a magnet mounted below the coils in parallel with a longitudinal axis thereof and
   means for applying power to said antenna.

2. The invention of claim 1 wherein said means for applying power includes an impedance matching network.

3. The invention of claim 1 wherein said means for applying power includes a source of radio-frequency power.

4. The invention of claim 3 wherein said means for applying power includes a switch between said source of radio-frequency power and antenna.

5. The invention of claim 1 further including means for retaining a substrate in said chamber.

6. The invention of claim 1 further including an electrically isolated electrode.

7. The invention of claim 6 wherein said electrode is mounted near a top surface of the chamber.

8. The invention of claim 7 wherein said electrode is powered by a radio frequency power supply.

9. An antenna for applying a uniform electromagnetic field to a volume of gas comprising:

a common input node;

a common output node;

at least one set of semi-circular half-turn coils, each set of half-turn coils forming a circular coil and each set of coils being coaxial with the other sets of coils and connected in parallel therewith via said common input node and said common output node, whereby current flow is enabled through each half-turn of each coil from said common input node to said common output node effective to radiate electromagnetic energy into said gas.

10. The antenna of claim 9 further including multiple conductors connected in parallel with said one conductor to said input node and said output node.

11. The antenna of claim 10 further including a dielectric tube.

12. The antenna of claim 11 wherein said multiple conductors are disposed around said dielectric tube.

13. The antenna of claim 12 further including a magnet mounted in proximity to said conductors.

14. The antenna of claim 13 further including an electrically isolated electrode mounted on a source.

15. The antenna of claim 14 further including a radio frequency power supply for driving said electrode.

* * * * *